United States Patent [19]
Christian

[11] Patent Number: 5,596,178
[45] Date of Patent: Jan. 21, 1997

[54] SINGLE REPLACEMENT PAD WITH PERFORATED SHAFT FOR THE REPAIR OF PRINTED CIRCUIT BOARDS

[76] Inventor: Suzanne Christian, 23 Indian Head Rd., Kings Park, N.Y. 11754

[21] Appl. No.: 542,308

[22] Filed: Oct. 12, 1995

[51] Int. Cl.⁶ .................................................. H05K 1/02
[52] U.S. Cl. ........................ 174/265; 174/262; 174/263; 29/843; 29/845
[58] Field of Search .................................. 174/265, 264, 174/263, 262, 266, 250; 29/842, 843, 845

[56] References Cited

U.S. PATENT DOCUMENTS

| | | | |
|---|---|---|---|
| 2,607,821 | 8/1952 | Van Arsdell, Jr. | |
| 3,027,494 | 3/1962 | Rayburn | |
| 3,103,547 | 9/1963 | Ansley | 174/68.5 |
| 3,357,856 | 12/1967 | Ragan et al. | 117/212 |
| 3,501,831 | 3/1970 | Gordon | |
| 3,573,707 | 4/1971 | Reynolds | 339/17 |
| 3,654,583 | 4/1972 | Mancini | 339/17 C |
| 3,919,602 | 11/1975 | Kaiser et al. | 317/101 |
| 4,065,850 | 1/1978 | Burr et al. | 29/625 |
| 4,545,119 | 10/1985 | Tanazawa | 29/839 |
| 5,010,448 | 4/1991 | Kobari | 361/403 |
| 5,079,065 | 1/1992 | Masakazu et al. | 428/137 |
| 5,263,248 | 11/1993 | Kiyota et al. | 29/846 |
| 5,281,770 | 1/1994 | Kamei et al. | 174/261 |

*Primary Examiner*—Laura Thomas
*Attorney, Agent, or Firm*—Dilworth & Barrese

[57] ABSTRACT

An apparatus is adapted to be secured in a substrate having at least one conductive path and at least one aperture therein. The apparatus includes a cap and a tubular shaft, connected to the cap and positioned in a first aperture of the substrate. The tubular shaft has an electrically conductive wall portion and perforations therethrough, with the electrically conductive wall portion being operatively connected to a first conductive path of the substrate, and the perforations are adapted to permit flowthrough of material. The material facilitates the securing of at least the tubular shaft to the substrate.

11 Claims, 1 Drawing Sheet

SINGLE REPLACEMENT PAD WITH PERFORATED SHAFT FOR THE REPAIR OF PRINTED CIRCUIT BOARDS

BACKGROUND OF THE INVENTION

1. Field of the Invention

This disclosure relates generally to printed circuit boards, and more particularly to the repair and replacement of components used in printed circuit boards.

2. Description of the Related Art

Electrical components may be electrically connected to each other by conductive paths to form functioning circuits on a circuit board. Such conductive paths may be established using a feedthrough extending through an aperture of the circuit board and which may be secured thereto. The electrical components are positioned in such feedthroughs, which may be electrically conductive, and electrically conductive lands or solidified solder may form the conductive paths between the feedthroughs, thus allowing electric currents to flow between components. The lands and/or solder also serve to secure the electrical components to the circuit board.

Electrically conductive solder may be applied in a liquid state to the contacts of the electrical components placed in the proximity of other electrically conductive elements, such as the feedthroughs, lands, and/or contacts with other electrical components, such that the solidification of the solder forms a secure and electrically conductive path.

An example of the use of solder and lands for printed circuit boards is shown in U.S. Pat. No. 5,010,448 to Kobari, where a printed circuit board having conductive paths between components is established by lands and solder. Portions of the lands are deleted to form holes or notches for reducing the amount of solder adhering to the lands and for preventing solder bridges between adjacent lands from forming.

The feedthroughs may be secured using known methods and apparatus such as disclosed in U.S. Pat. No. 4,545,119 to Tanazawa, where a feedthrough is positioned in an aperture of the printed circuit board and then formed to be secured to the printed circuit board.

As shown in FIG. 1, a flat pad 2 is shown having a central aperture, which is used, as shown in FIG. 2, with a circuit board 4 and a feedthrough 6 having inner walls 8. After being positioned, the original pad 2 may be secured to the feedthrough 6 by solder, adhesive, or the like. However, such securing of the original pad 2 may be deficient, and so the original pad 2 may come loose from the feedthrough 6 by, for example, heat and/or pressure such as an iron applied to the circuit board 4. It would be beneficial to replace the original pad 6 with a replacement pad that is more securely positioned to the feedthrough 6 and/or land.

SUMMARY

An apparatus is disclosed which is adapted to be secured in a substrate having at least one conductive path and at least one aperture therein. The apparatus includes a cap and a tubular shaft which is connected to the cap and positioned in a first aperture of the substrate. The tubular shaft has an electrically conductive wall portion and perforations therethrough, with the electrically conductive wall portion being operatively connected to a first conductive path of the substrate, and the perforations are adapted to permit flowthrough of material. The material facilitates the securing of at least the tubular shaft to the substrate.

BRIEF DESCRIPTION OF THE DRAWINGS

The features of the disclosed replacement pad will become more readily apparent and may be better understood by referring to the following detailed description of an illustrative embodiment of the present invention, taken in conjunction with the accompanying drawings, where.

DETAILED DESCRIPTION OF PREFERRED EMBODIMENTS

Figure 3:
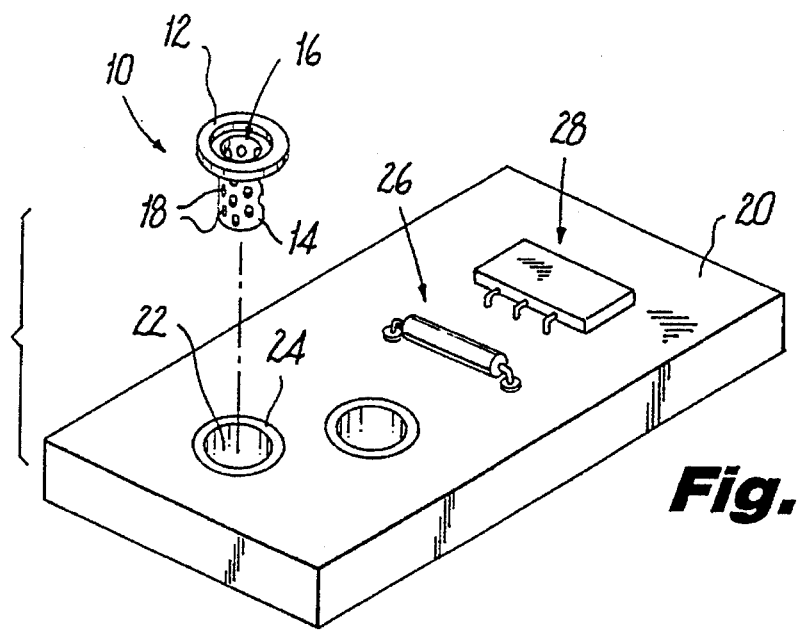
FIG. 3 illustrates a perspective view of the disclosed replacement pad and a printed circuit board.
Figure 4:
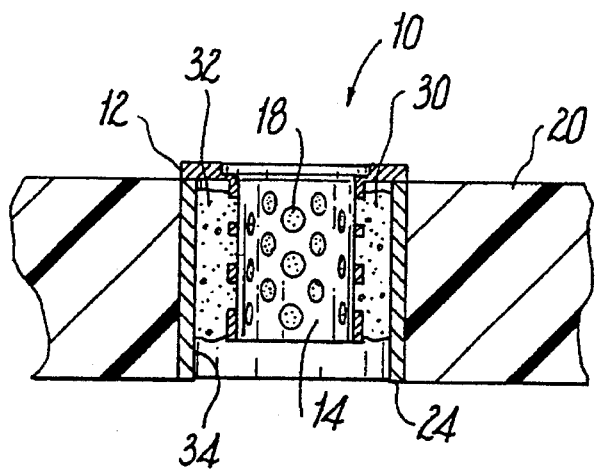
FIG. 4 illustrates a side cross-section view of the replacement pad disposed in the printed circuit board.

Referring now in specific detail to the drawings, with like reference numerals identifying similar or identical elements, as shown in FIGS. 3–4, the present disclosure describes a replacement pad for use in the repair and replacement of pads used with printed circuit boards. The single replacement pad 10 has a generally tubular structure formed from a metallic material or alloy, which may be substantially rigid. The replacement pad 10 includes a cap 12 and a shaft 14, with an aperture 16 extending along a longitudinal axis through the cap 12 and the shaft 14. The shaft 14 includes at least one perforation 18 in a wall portion of the shaft 14, where the perforation 18 has a central axis in a transverse orientation relative to the longitudinal axis of the shaft 14. The perforation 18 provides a path for the flow of solder and/or other liquid or gaseous materials through the aperture 16 to the region surrounding the shaft 14.

Although the shaft 14 in FIGS. 3–4 is shown with a circumferential wall having a substantially circular cross-section, other configurations are also contemplated, including polygonal, oval, etc.

In an exemplary embodiment, the single replacement pad 10 is used in conjunction with a single layer printed circuit board 20 having at least one aperture 22. It is understood that multi-layer printed circuit boards may be used as well. The term "aperture" is herein defined as an opening in at least one surface of the printed circuit board, and may include a shaft extending at least partially through at least one layer of the printed circuit board 20, and may also include a shaft or bore through all layers and extending from a plurality of surfaces of the printed circuit board 20.

The printed circuit board 20 may have a feedthrough 24 or eyelet substantially adjacent to and/or extending through the aperture 22. The term "feedthrough" is defined herein to include lands and other structures used with printed circuit boards for providing electrical contact between electrical components.

Figure 1:
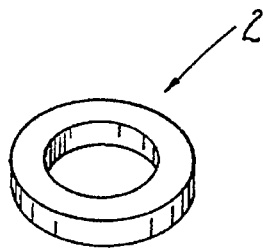
FIG. 1 illustrates a perspective view of a flat pad in the prior art.
Figure 2:
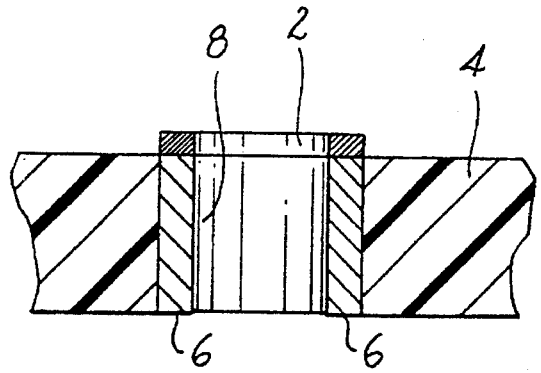
FIG. 2 illustrates a side cross-section view of the flat pad positioned on a feedthrough and circuit board in the prior art.

The aperture 22 and any feedthrough 24 may be provided for securing electric and electronic components such as, for example, resistor 26 and integrated circuit 28, to the printed circuit board 20, as shown in FIG. 3. Typically, an original flat pad 2, as shown in FIGS. 1–2, is positioned and may be secured on the feedthrough 6 and/or the circuit board 8. However, excess heat or the use of a solder removing device to remove solder from the region of the original pad 2 may be inadvertently loosen or remove the original pad 2, requiring replacement.

In the exemplary embodiment, the disclosed single replacement pad 10 may be positioned within the aperture 22 and feedthrough 24, as shown in greater detail in FIG. 4, to replace the original pad 6. The printed circuit board 20 may be a single layer circuit board, with at least one aperture 22 extending therethrough.

After the single replacement pad 10 is positioned in the feedthrough 24, the cap 12 may be positioned substantially adjacent the aperture of the feedthrough 24, or may be positioned substantially adjacent the aperture 22 of the printed circuit board 20. In the exemplary embodiment, the cap 12 has a sufficient diameter to extend across the aperture of the printed circuit board 20 and/or the feedthrough 24 for the replacement pad 10 to be positioned until secured by solder, as described below. In the configuration shown in FIG. 4, the shaft 14 extends about halfway through the length of the feedthrough 24. It is understood that any length may be provided for the shaft 14, and so is not limited to a longitudinal length of about half of the length of the feedthrough 24.

When the single replacement pad 10 is positioned in the feedthrough 24 as shown in FIG. 4, the single replacement pad 10 provides a flow path through aperture 16 and also through the perforation 18, allowing solder or other liquids or gaseous material to be applied to the region or gap surrounding the shaft 14. For example, solder 30, 32 may be applied to contact the inner wall portions of the feedthrough 24; for example, inner wall 34 of the feedthrough 24 shown in FIG. 4.

Once the solder 30, 32 solidifies, an electrically conductive path may be formed between the shaft 14 and the feedthrough 24. The surface area of the shaft 14 may be relative large compared to the surface area associated with the perforation 18, and the solder 30, 32 may also remain in the perforation 18 after solidification, so any capacitive or conductivity effects of the perforation 18 are minimal.

Thus, substantially continuous electrical contact may be provided by the replacement pad 10 and the feedthrough 24, where the replacement pad 10, the feedthrough 24, and solder 30, 32 may be electrically conductive. The substantially continuous electrical contact permits component leads to be positioned and soldered in the replacement pad 10, and thus to the printed circuit board 20.

The replacement pad 10 may be positioned as shown in FIG. 4 with solder 30, 32 securing the replacement pad 10 to portions of the feedthrough 20. The component leads may then be positioned in the shaft 14 with less leeway for motion after soldering to provide a relatively stable configuration. In addition, the volume of the shaft 14 of the replacement pad 10 may, in effect, replace extra solder which would be required without the use of the replacement pad 10. Thus, the use of replacement pads allows for the saving of solder.

While the disclosed replacement pad and method of use have been particularly shown and described with reference to the preferred embodiments, it is understood by those skilled in the art that various modifications in form and detail may be made therein without departing from the scope and spirit of the invention. Accordingly, modifications such as those suggested above, but not limited thereto, are to be considered within the scope of the invention.

What is claimed is:

1. An apparatus adapted to be secured in a substrate having at least one conductive path and at least one aperture therein, the apparatus comprising:

a cap; and a tubular shaft, connected to the cap and positioned in a first aperture of the substrate, the tubular shaft having a longitudinal length of about one-half of a longitudinal length associated with the first aperture of the substrate, and having an electrically conductive wall portion and perforations therethrough, the electrically conductive wall portion operatively connected electrically to a first conductive path of the substrate, the perforations adapted to permit flowthrough of material, wherein the material facilitates the securing of at least the tubular shaft to the substrate.

2. The apparatus of claim 1 wherein the first aperture of the substrate has a first diameter associated therewith; and the cap has a second diameter greater than the first diameter.

3. The apparatus of claim 1 wherein the shaft is adapted to permit solder as the material to flow through the perforations for subsequent solidification.

4. The apparatus of claim 3 wherein the shaft is operatively connected electrically to the first conductive path by the solder.

5. An apparatus adapted to be secured in a substrate having at least one conductive path and at least one aperture therein, the apparatus comprising:

a cap having a first central aperture; and a tubular shaft, connected to the cap and positioned in a first aperture of the substrate, the tubular shaft having:

a second central aperture connected to the first central aperture; and a substantially contiguous electrically conductive wall portion and perforations therethrough, the electrically conductive wall portion having a longitudinal length of about one-half of a longitudinal length associated with the first aperture of the substrate, the electrically conductive wall portion being operatively connected electrically to a first conductive path of the substrate, the perforations adapted to permit flowthrough of solder for securing at least the shaft.

6. The apparatus of claim 5 wherein the tubular shaft is adapted to be positioned within a tubular feedthrough as the structure connected to the substrate.

7. The apparatus of claim 5 wherein the shaft is adapted to permit solder to flow through the perforations for subsequent solidification in a gap between a wall portion of the tubular feedthrough and the shaft for sealing the gap.

8. The apparatus of claim 7 wherein the shaft is operatively connected electrically to a first conductive path of the substrate by the solder.

9. A method for replacing a pad from a position substantially adjacent a feedthrough disposed in an aperture of a substrate having at least one conductive path, the feedthrough disposed for electrical connection to a first conductive path and including a central aperture extending along a longitudinal length of the feedthrough, the feedthrough further including a circumferential wall, the method comprising the steps of:

providing a replacement pad including a tubular shaft having a longitudinal length of about one-half of a longitudinal length associated with the aperture and having a substantially contiguous wall portion and perforations therethrough;

positioning the replacement pad into the central aperture of the feedthrough, the replacement pad including the tubular shaft having the substantially contiguous wall portion and perforations therethrough extending into the central aperture;

inserting solder through the tubular shaft;

allowing the solder to flow through the perforations to contact the feedthrough; and hardening the solder to secure the shaft of the replacement pad to the feedthrough.

11. The method of claim 9 wherein the step of hardening the solder includes the step of:

establishing, by the hardened solder, an electrically conductive path between the shaft and the feedthrough.

11. The method of claim 9 wherein the step of positioning the replacement pad into the central aperture of the feedthrough includes the step of positioning the tubular shaft to extend about half of the longitudinal length of the feedthrough.

\* \* \* \* \*